(12) United States Patent
Park et al.

(10) Patent No.: US 10,811,079 B2
(45) Date of Patent: Oct. 20, 2020

(54) SEMICONDUCTOR MEMORY APPARATUS AND METHOD OF DRIVING THE SAME

(71) Applicant: SAMSUNG ELECTRONICS CO., LTD., Suwon-si, Gyeonggi-Do (KR)

(72) Inventors: Chan Min Park, Hwaseong-si (KR); Dae Sun Kim, Hwaseong-si (KR); In Cheol Nam, Hwaseong-si (KR); Chang Soo Lee, Hwaseong-si (KR); Jin Seok Jeong, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/268,807

(22) Filed: Feb. 6, 2019

(65) Prior Publication Data

US 2020/0111520 A1 Apr. 9, 2020

(30) Foreign Application Priority Data

Oct. 8, 2018 (KR) .................. 10-2018-0119625

(51) Int. Cl.
*G11C 11/4074* (2006.01)
*G11C 11/4096* (2006.01)
*G11C 11/408* (2006.01)

(52) U.S. Cl.
CPC ...... *G11C 11/4074* (2013.01); *G11C 11/4087* (2013.01); *G11C 11/4096* (2013.01)

(58) Field of Classification Search
CPC ............ G11C 11/4074; G11C 11/4087; G11C 11/4096

USPC ..................................................... 365/189.09
See application file for complete search history.

(56) References Cited

U.S. PATENT DOCUMENTS

| | | | |
|---|---|---|---|
| 5,151,614 A | 9/1992 | Yamazaki et al. | |
| 6,519,191 B1 * | 2/2003 | Morishita | ............... G11C 5/14 365/189.09 |
| 6,963,230 B2 | 11/2005 | Morishita | |
| 7,804,722 B2 | 9/2010 | Jang | |

(Continued)

FOREIGN PATENT DOCUMENTS

KR 10-0766378 10/2007
KR 1020177022378 2/2016

*Primary Examiner* — Harry W Byrne
(74) *Attorney, Agent, or Firm* — F. Chau & Associates, LLC

(57) ABSTRACT

A semiconductor memory apparatus includes a memory cell unit and an internal voltage stabilization apparatus. The memory cell unit includes a row decoder, a column decoder, and a memory cell array. The internal voltage stabilization apparatus includes an operation termination determination unit configured to determine whether an operation of the semiconductor memory apparatus is terminated on the basis of an external input voltage and output an operation termination command, a termination voltage generation unit configured to generate a termination voltage having a preset voltage value on the basis of a determination result of operation termination by the operation termination determination unit, and a switch unit. The switch unit includes a plurality of switches that are turned in response to the operation termination command, and supplies the termination voltage, input from the termination voltage generation unit, to a plurality of internal nodes of the memory cell array.

12 Claims, 11 Drawing Sheets

(56) References Cited

U.S. PATENT DOCUMENTS

| | | | |
|---|---|---|---|
| 2002/0008999 A1* | 1/2002 | Hidaka | H03K 19/0016 365/200 |
| 2006/0091938 A1 | 5/2006 | Kim | |
| 2007/0133317 A1 | 6/2007 | Yuan et al. | |
| 2012/0033506 A1* | 2/2012 | Furutani | G11C 5/147 365/189.07 |
| 2012/0155207 A1* | 6/2012 | Kodama | G11C 5/145 365/226 |
| 2013/0242683 A1* | 9/2013 | Tanuma | G11C 11/4097 365/226 |
| 2013/0265838 A1 | 10/2013 | Li | |
| 2015/0364204 A1 | 12/2015 | Kim et al. | |
| 2017/0337975 A1 | 11/2017 | Lee | |
| 2018/0019656 A1 | 1/2018 | Matsuda et al. | |

* cited by examiner

SEMICONDUCTOR MEMORY APPARATUS AND METHOD OF DRIVING THE SAME

CROSS-REFERENCE TO RELATED APPLICATION

This application claims priority under 35 U.S.C. § 119 to Korean Patent Application No. 10-2018-0119625, filed on Oct. 8, 2018 in the Korean Intellectual Property Office, the disclosure of which is incorporated by reference herein in its entirety.

TECHNICAL FIELD

Exemplary embodiments of the inventive concept relate to an internal voltage stabilization apparatus capable of stabilizing an internal voltage when an operation of a dynamic random access memory (DRAM) is terminated, a semiconductor memory apparatus including the internal voltage stabilization apparatus, and a method of driving the semiconductor memory apparatus.

DISCUSSION OF RELATED ART

For continuous operation of a dynamic random access memory (DRAM), voltages of internal nodes are set to have an initial value when power is applied. When an operation of the DRAM is terminated, charges remain in a power capacitor. However, separate processing is not performed on the charges remaining in the power capacitor to stabilize an internal voltage. As DRAM design rules are reduced and patterns are miniaturized, operation errors and unexpected problems may occur due to charges remaining in the power capacitor after an operation of the DRAM is terminated.

SUMMARY

According to an exemplary embodiment of the inventive concept, a semiconductor memory apparatus includes a memory cell unit and an internal voltage stabilization apparatus. The memory cell unit includes a row decoder configured to decode a row address signal and generate a plurality of word line selection signals, a column decoder configured to decode a column address signal and generate a plurality of column selection signals, and a memory cell array including a plurality of memory cells connected between a plurality of word lines and a plurality of bit lines. The internal voltage stabilization apparatus includes an operation termination determination unit configured to determine whether an operation of the semiconductor memory apparatus is terminated on the basis of an external input voltage and output an operation termination command, a termination voltage generation unit configured to generate a termination voltage having a preset voltage value on the basis of a determination result of operation termination by the operation termination determination unit, and a switch unit. The switch unit includes a plurality of switches that are turned on in response to the operation termination command, and supplies the termination voltage, input from the termination voltage generation unit, to a plurality of internal nodes of the memory cell array.

According to an exemplary embodiment of the inventive concept, a semiconductor memory apparatus includes a memory cell array including a plurality of memory cells, a write path unit connected to the memory cell array, a data input unit connected to the write path unit, and an internal voltage stabilization apparatus configured to determine whether an operation of the semiconductor memory apparatus is terminated on the basis of an external input voltage, generate a termination voltage having a preset voltage value when it is determined that the operation is terminated, and supply the termination voltage to a plurality of internal nodes of the memory cell array.

According to an exemplary embodiment of the inventive concept, a semiconductor memory apparatus includes a memory cell array including a plurality of memory cells, and an internal voltage stabilization apparatus configured to determine whether an operation of the semiconductor memory apparatus is terminated on the basis of an external input voltage, generate one termination voltage having a preset voltage value when it is determined that the operation is terminated, and supply the one termination voltage to a plurality of internal nodes of the memory cell array. The memory cell array includes a plurality of input lines for inputting the one termination voltage. The internal voltage stabilization apparatus includes an operation termination determination unit configured to determine whether the operation of the semiconductor memory apparatus is terminated and output an operation termination command, a termination voltage generation unit configured to adjust a value of the one termination voltage according to a voltage mode which is input thereto, and a switch unit which includes a plurality of switches that are turned on in response to the operation termination command, and outputs the one termination voltage to the plurality of internal nodes of the memory cell array.

DETAILED DESCRIPTION OF THE EMBODIMENTS

Figure 1:
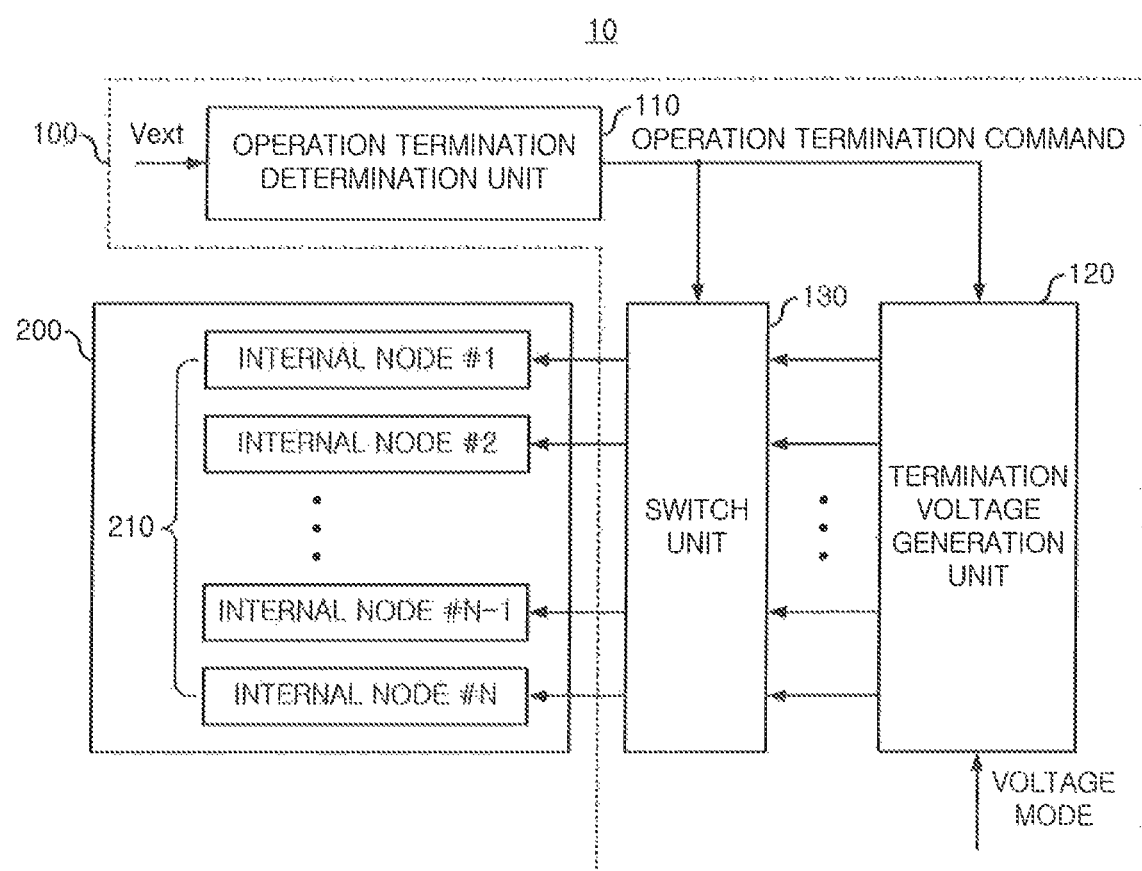
FIG. 1 is a diagram showing a semiconductor memory apparatus according to an exemplary embodiment of the inventive concept.

Exemplary embodiments of the inventive concept are directed to providing an internal voltage stabilization apparatus capable of stabilizing an internal voltage when an operation of a dynamic random access memory (DRAM) is terminated.

Exemplary embodiments of the inventive concept are also directed to providing a semiconductor memory apparatus including an internal voltage stabilization apparatus capable of stabilizing an internal voltage when an operation of a DRAM is terminated, and a method of driving the same.

Hereinafter, an internal voltage stabilization apparatus, a semiconductor memory apparatus including the internal voltage stabilization apparatus, and a method of driving the semiconductor memory apparatus according to exemplary embodiments of the inventive concept will be described with reference to the accompanying drawings. Like reference numerals may refer to like elements throughout this application.

FIG. 1 is a diagram showing a semiconductor memory apparatus according to an exemplary embodiment of the inventive concept.

Referring to FIG. 1, a semiconductor memory apparatus 10 according to an exemplary embodiment of the inventive concept may be a dynamic random access memory (DRAM), such as a double data rate synchronous dynamic random-access memory (DDR SDRAM), a low power double data rate (LPDDR) SDRAM, a graphics double data rate (GDDR) SDRAM, a Rambus dynamic random-access memory (RDRAM), or the like.

The semiconductor memory apparatus 10 according to an exemplary embodiment of the inventive concept may include an internal voltage stabilization apparatus 100 and a memory unit 200. The internal voltage stabilization apparatus 100 may include an operation termination determination unit 110, a termination voltage generation unit 120, and a switch unit 130. The memory unit 200 may include a memory cell array 210 in which a plurality of memory cells are arranged.

Figure 2:
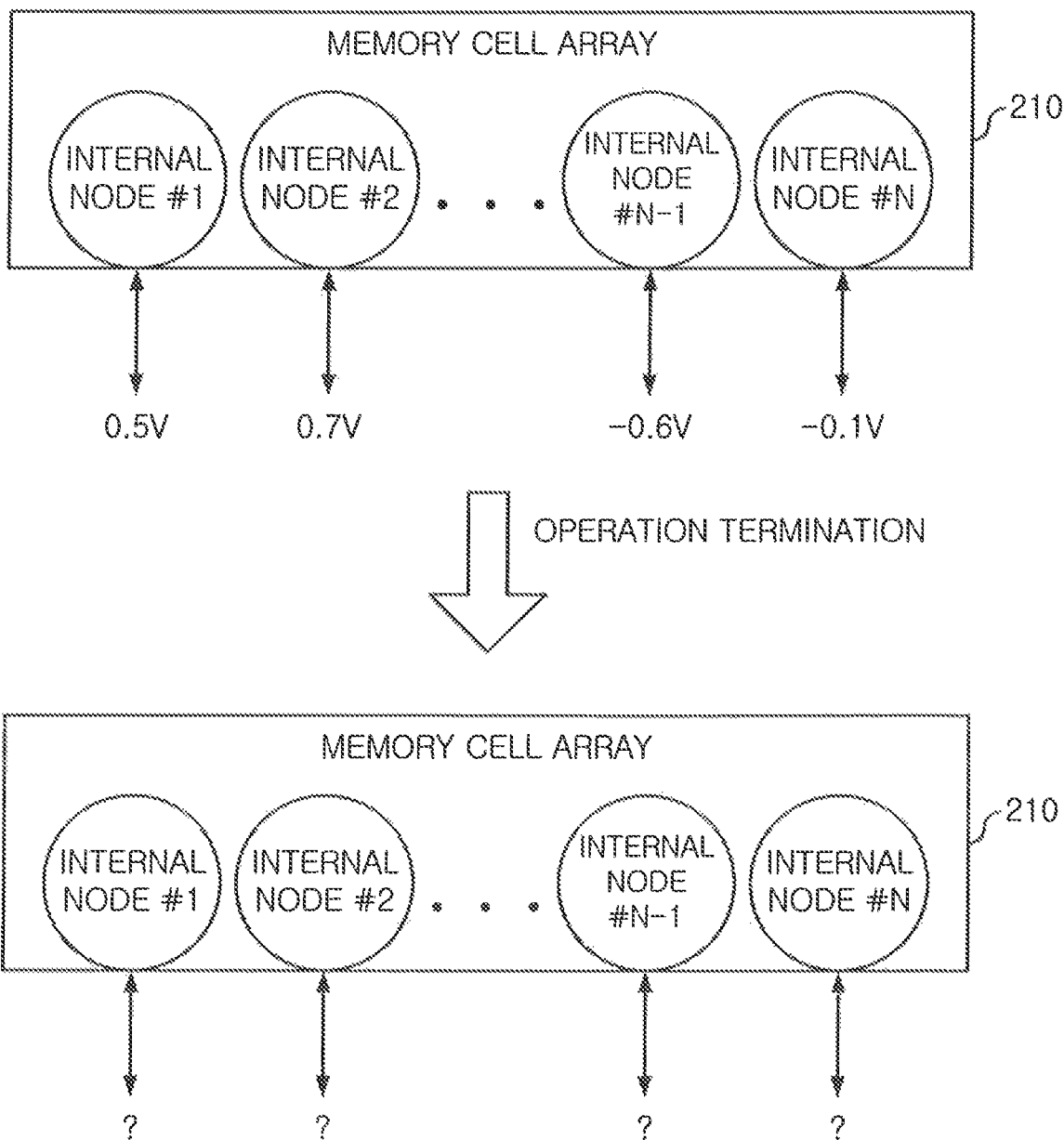
FIG. 2 is a diagram for describing a case when voltages remain in internal nodes after an operation of a memory apparatus is terminated.

FIG. 2 is a diagram for describing a case when voltages remain in internal nodes after an operation of a memory apparatus is terminated.

Referring to FIGS. 1 and 2, when writing and loading operations of the semiconductor memory apparatus 10 are terminated, charges, which are previously injected in internal nodes of the memory cell array 210, remain in the internal nodes of the memory cell array 210. It may not be known how the charges remaining in the internal nodes will change. When charges having the same polarity are concentrated on a specific internal node of the memory cell array 210, a potential difference may be generated between the specific internal node and other internal nodes. When a potential difference is generated between the internal nodes, the charges move, and a charge loss of a capacitor may be caused by the movement of the charges. In addition, an operation error may occur in a next operation of the semiconductor memory apparatus 10 due to the movement of the charges between the internal nodes.

In the semiconductor memory apparatus 10 according to an exemplary embodiment of the inventive concept, the internal voltage stabilization apparatus 100 may detect that the operation of the semiconductor memory apparatus 10 is terminated and generate a termination voltage.

The internal voltage stabilization apparatus 100 may input the generated termination voltage into the internal nodes of the memory cell array 210 of the memory unit 200. The internal voltage stabilization apparatus 100 may supply the termination voltage to the internal nodes of the memory cell array 210 to stabilize voltages of the internal nodes when the operation of the semiconductor memory apparatus 10 is terminated.

Figure 3:
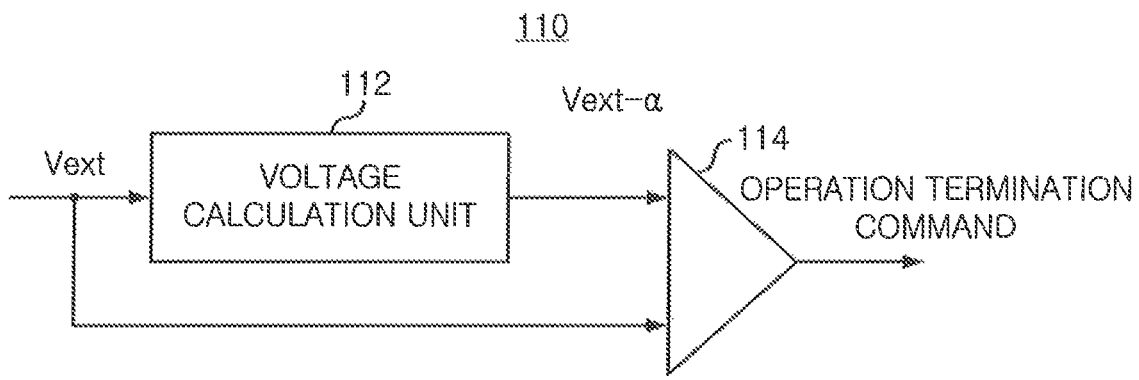
FIG. 3 is a diagram showing an operation termination determination unit of FIG. 1 according to an exemplary embodiment of the inventive concept.

FIG. 3 is a diagram showing an operation termination determination unit of FIG. 1 according to an exemplary embodiment of the inventive concept.

Referring to FIGS. 1 and 3, the operation termination determination unit 110 may include a voltage calculation unit 112 and an operation termination command generation unit 114.

The voltage calculation unit 112 determines whether an external voltage Vext which is input from the outside matches a preset reference voltage, to determine whether the operation of the semiconductor memory apparatus 10 is terminated. The voltage calculation unit 112 may calculate a calculation value Vext-α according to a result of the determination and output the calculation value Vext-α to the operation termination command generation unit 114.

The operation termination command generation unit 114 may determine whether the operation of the semiconductor memory apparatus 10 is terminated by comparing the external voltage Vext with the calculation value Vext-α which is input from the voltage calculation unit 112.

For example, the operation termination command generation unit 114 may determine that the operation of the semiconductor memory apparatus 10 is terminated when the external voltage Vext which is input from the outside gradually decreases with time and reaches the preset reference voltage.

For example, the operation termination command generation unit 114 may detect a change in the external voltage Vext which is input from the outside and determine that the operation of the semiconductor memory apparatus 10 is terminated when the external voltage Vext reaches the preset reference voltage.

For example, the operation termination command generation unit 114 may determine that the operation of the semiconductor memory apparatus 10 is terminated when the external voltage Vext which is input from the outside gradually increases with time and reaches the preset reference voltage.

When the operation termination command generation unit 114 determines that the operation of the semiconductor memory apparatus 10 is terminated, the operation termination command generation unit 114 may generate an operation termination command. The operation termination command generation unit 114 may output the operation termination command to the termination voltage generation unit 120 and the switch unit 130.

Figure 4A:
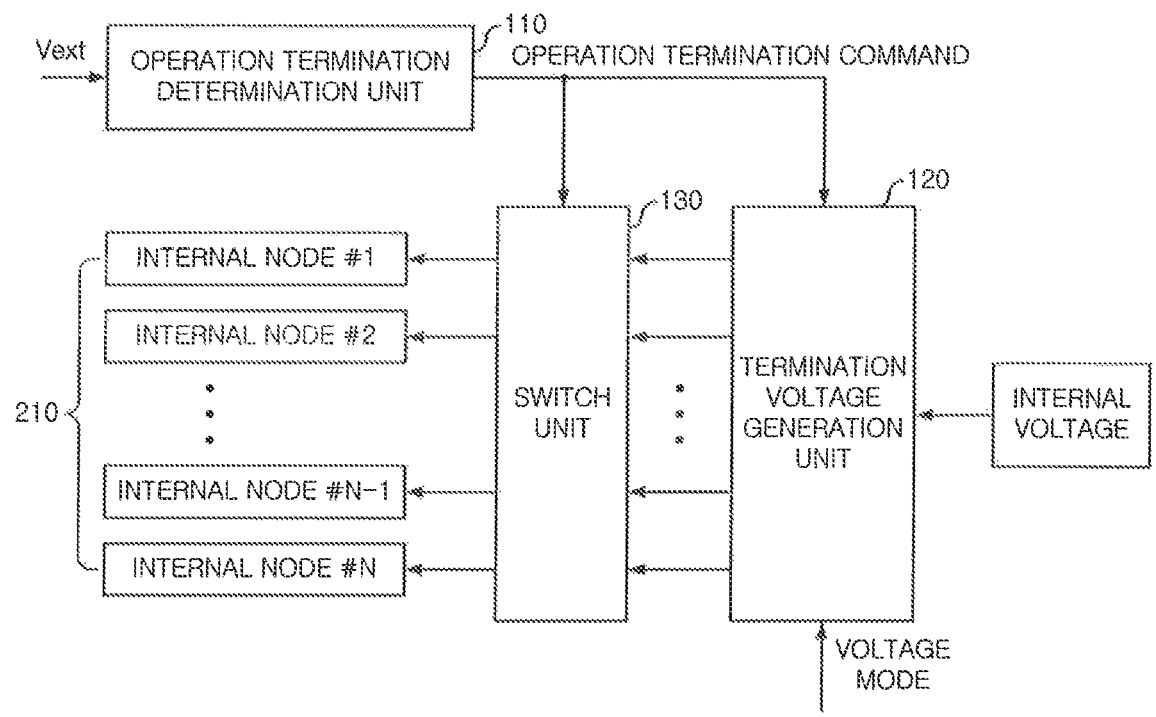
FIG. 4A is a diagram showing an example in which a termination voltage is output using an internal voltage according to an exemplary embodiment of the inventive concept.

FIG. 4A is a diagram showing an example in which a termination voltage is output using an internal voltage according to an exemplary embodiment of the inventive concept.

Referring to FIG. 4A, the termination voltage generation unit 120 may generate a termination voltage in response to the operation termination command which is input from the operation termination determination unit 110. The termination voltage generation unit 120 may adjust a value of the termination voltage on the basis of a voltage mode which is input thereto. For example, the termination voltage generation unit 120 may generate the termination voltage having a voltage value of 0 V to −10 V on the basis of the voltage mode. For example, the termination voltage may be greater than or equal to 0 V and less than or equal to −10 V. For example, the termination voltage generation unit 120 may receive an internal voltage generated in the semiconductor memory apparatus 10 and generate the termination voltage having a preset voltage value. The termination voltage generation unit 120 may output the generated termination voltage to the switch unit 130.

For example, the termination voltage generation unit 120 may receive the internal voltage generated in the semiconductor memory apparatus 10. The termination voltage generation unit 120 may output the generated internal voltage to the switch unit 130 as the termination voltage. Therefore, the termination voltage generation unit 120 does not need to have a separate circuit for changing a voltage, and thus the manufacturing cost may be reduced and the circuit design may be simplified.

Figure 4B:
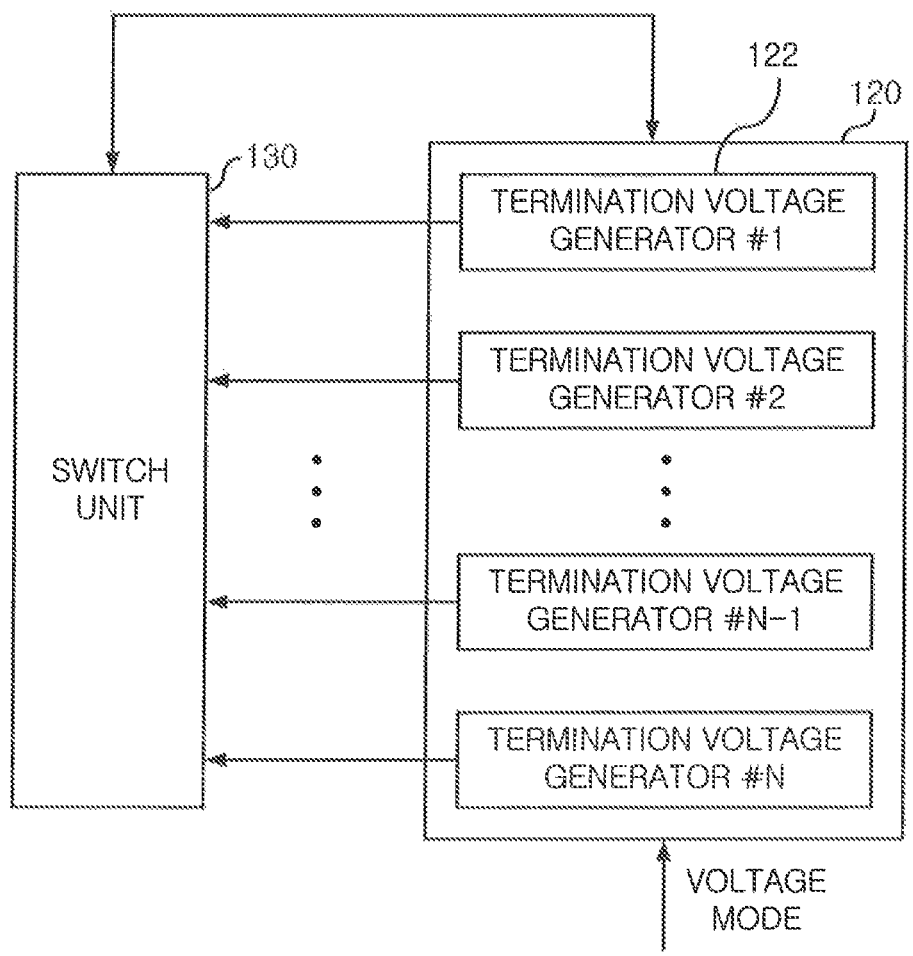
FIG. 4B is a diagram showing a termination voltage generation unit of FIG. 1 which generates a plurality of termination voltages and outputs the plurality of termination voltages according to a voltage mode according to an exemplary embodiment of the inventive concept.

FIG. 4B is a diagram showing a termination voltage generation unit of FIG. 1 which generates a plurality of termination voltages and outputs the plurality of termination voltages according to a voltage mode according to an exemplary embodiment of the inventive concept.

Referring to FIG. 4B, the termination voltage generation unit 120 may generate the termination voltage in response to the operation termination command which is input from the operation termination determination unit 110. The termination voltage generation unit 120 may include a plurality of termination voltage generators 122. The plurality of termination voltage generators 122 may adjust a value of the termination voltage on the basis of a voltage mode which is input thereto.

For example, the termination voltage generation unit 120 may generate the termination voltage having a preset voltage value on the basis of the voltage mode which is input thereto. The termination voltage generation unit 120 may generate the termination voltage having a voltage value of 0 V to −10 V. The plurality of termination voltage generators 122 may all generate termination voltages having the same voltage value. Alternatively, the plurality of termination voltage generators 122 may generate termination voltages having different voltage values. The termination voltages generated in the plurality of termination voltage generators 122 may be output to the switch unit 130.

As another example, some of the plurality of termination voltage generators 122 may generate a first termination voltage having a first voltage value. The remaining termination voltage generators 122 among the plurality of termination voltage generators 122 may generate a second termination voltage having a second voltage value. The termination voltage generation unit 120 may output the first termination voltage and the second termination voltage to the switch unit 130.

For example, the first termination voltage and the second termination voltage generated in the termination voltage generation unit 120 may be input to different switches of the switch unit 130. The first termination voltage may be input to a first switch of the switch unit 130, and the second termination voltage may be input to a second switch of the switch unit 130. The first switch of the switch unit 130 may supply the first termination voltage to a first internal node of the memory cell array 210. The second switch of the switch unit 130 may supply the second termination voltage to a second internal node of the memory cell array 210.

Figure 4C:
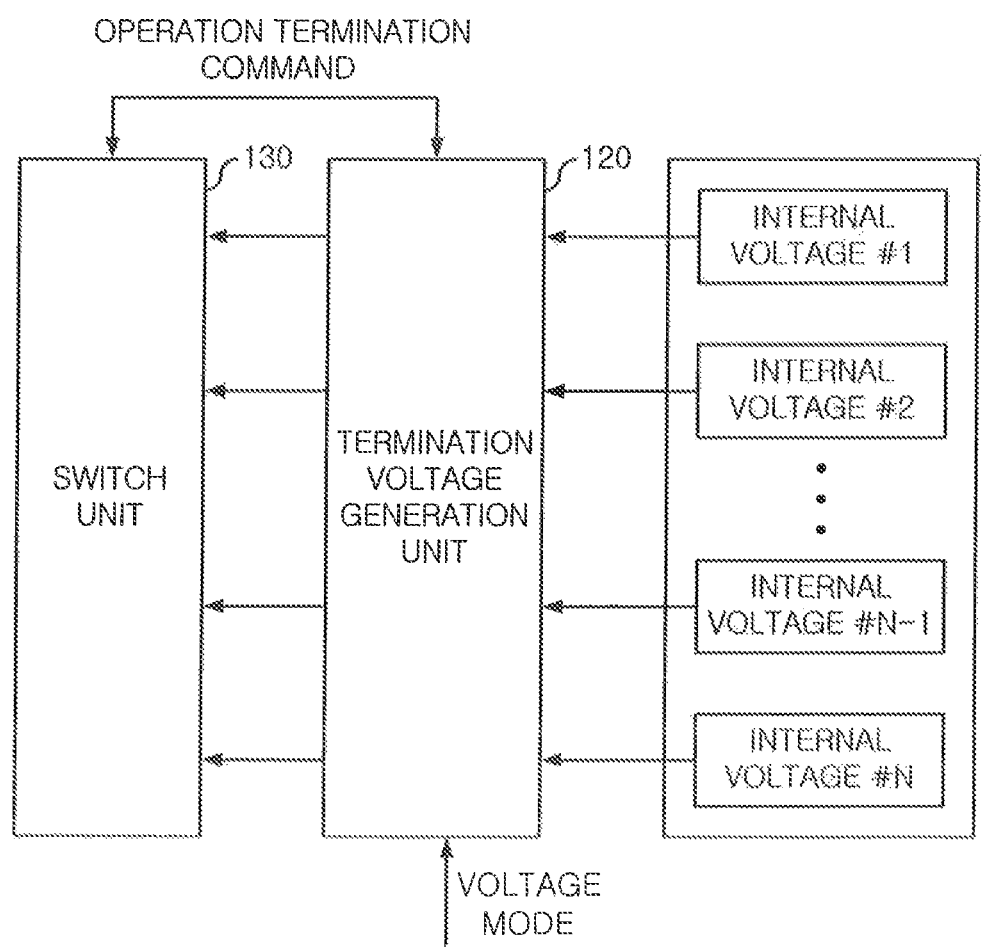
FIG. 4C is a diagram showing the termination voltage generation unit of FIG. 1 which selects one internal voltage among a plurality of internal voltages according to a voltage mode and outputs the selected one internal voltage as a termination voltage according to an exemplary embodiment of the inventive concept.

FIG. 4C is a diagram showing the termination voltage generation unit of FIG. 1 which selects one internal voltage among a plurality of internal voltages according to a voltage mode and outputs the selected one internal voltage as a termination voltage according to an exemplary embodiment of the inventive concept.

Referring to FIG. 4C, the termination voltage generation unit 120 may generate the termination voltage in response to the operation termination command which is input from the operation termination determination unit 110. The termination voltage generation unit 120 may adjust a value of the termination voltage according to a voltage mode which is input thereto. The termination voltage generation unit 120 may generate the termination voltage having a voltage value of 0 V to −10 V according to the voltage mode.

For example, the termination voltage generation unit 120 may receive a plurality of internal voltages generated in the semiconductor memory apparatus 10. The termination voltage generation unit 120 may output the internal voltages to the switch unit 130 as termination voltages.

For example, the termination voltage generation unit 120 may output one of the plurality of internal voltages generated in the semiconductor memory apparatus 10 as a termination voltage on the basis of the voltage mode which is input thereto. One termination voltage may be output from the termination voltage generation unit 120 to the switch unit 130.

For example, the termination voltage generation unit 120 may output each of the plurality of internal voltages generated in the semiconductor memory apparatus 10 as the termination voltage, on the basis of the voltage mode which is input thereto. A plurality of termination voltages having different voltage values may be output from the termination voltage generation unit 120 to the switch unit 130.

For example, the termination voltage generation unit 120 may output some of the plurality of internal voltages generated in the semiconductor memory apparatus 10 as the termination voltages on the basis of the voltage mode which is input thereto. The termination voltage generation unit 120 may output a first internal voltage of the plurality of internal voltages generated in the semiconductor memory apparatus 10 to the switch unit 130 as a first termination voltage. The termination voltage generation unit 120 may output a second internal voltage of the plurality of internal voltages generated in the semiconductor memory apparatus 10 to the switch unit 130 as a second termination voltage.

The termination voltage generation unit 120 may transmit the internal voltages generated in the semiconductor memory apparatus 10 to the switch unit 130. Therefore, the termination voltage generation unit 120 does not need to have a separate circuit for changing a voltage, and thus the manufacturing cost may be reduced and the circuit design may be simplified.

Figure 5:
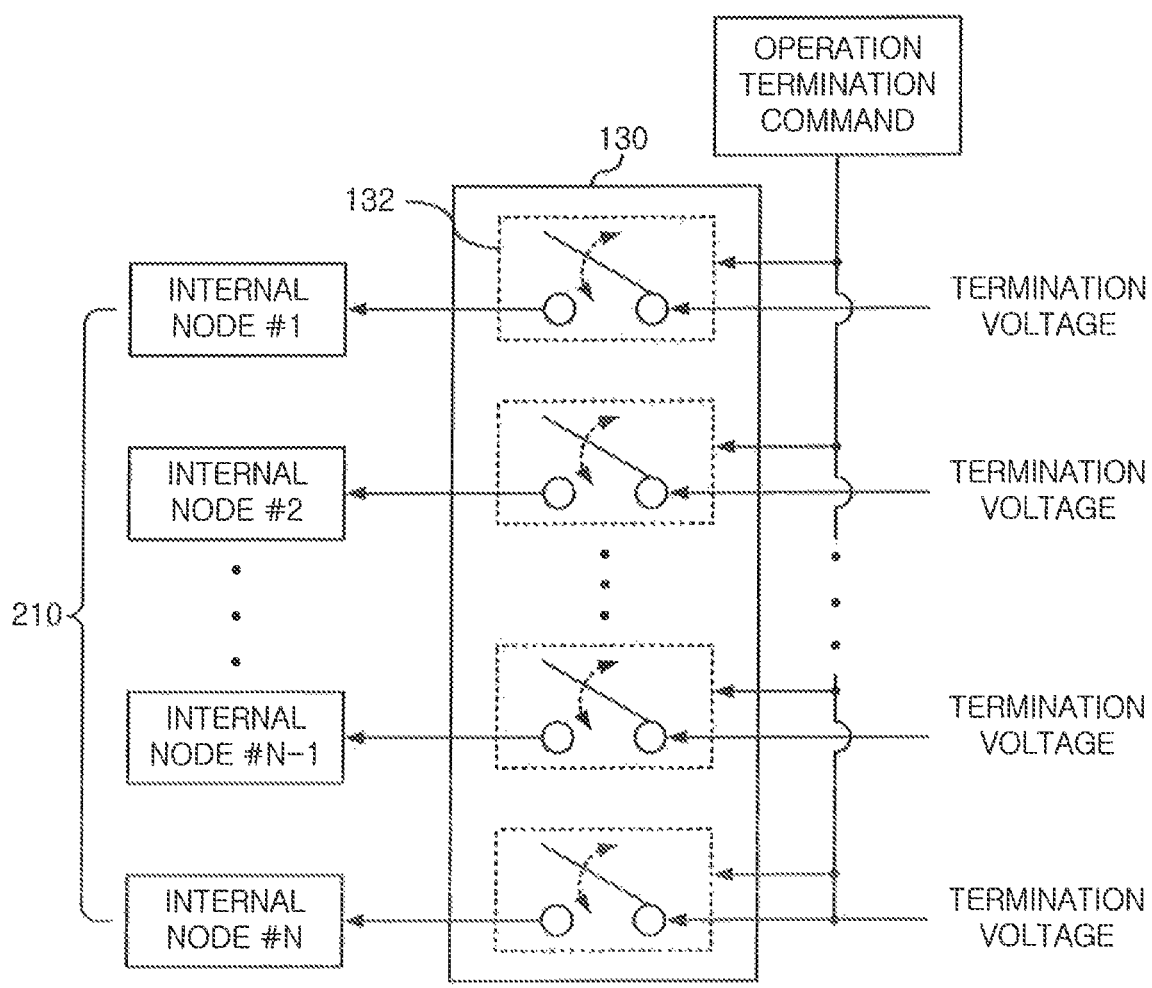
FIG. 5 is a diagram showing a switch unit of FIG. 1 which is operated by an operation termination command so that a termination voltage is input to an internal node of a memory cell array of FIG. 1 according to an exemplary embodiment of the inventive concept.

FIG. 5 is a diagram showing a switch unit of FIG. 1 which is operated by an operation termination command so that a termination voltage is input to an internal node of a memory cell array of FIG. 1 according to an exemplary embodiment of the inventive concept.

Referring to FIGS. 1, 4A to 4C, and 5, the switch unit 130 may include a plurality of switches 132. Each of the plurality of switches 132 may be connected to a corresponding one of a plurality of internal nodes of the memory cell array 210. Each of the plurality of switches 132 may be turned on when the operation termination command is input from the operation termination determination unit 110. When the plurality of switches 132 are turned on, termination voltages which are input from the termination voltage generation unit 120 may be input to the internal nodes of the memory cell array 210.

For example, one termination voltage may be supplied to the switch unit 130. The plurality of switches 132 may be simultaneously turned on by the operation termination command. When the plurality of switches 132 are turned on, termination voltages having the same voltage value may be input to all of the internal nodes of the memory cell array 210.

For example, a plurality of termination voltages having different voltage values may be supplied to the switch unit 130. The plurality of switches 132 may be simultaneously turned on by the operation termination command. When the plurality of switches 132 are turned on, each of the plurality of termination voltages having different voltage values may be input to a corresponding one of the internal nodes of the memory cell array 210.

Figure 6:
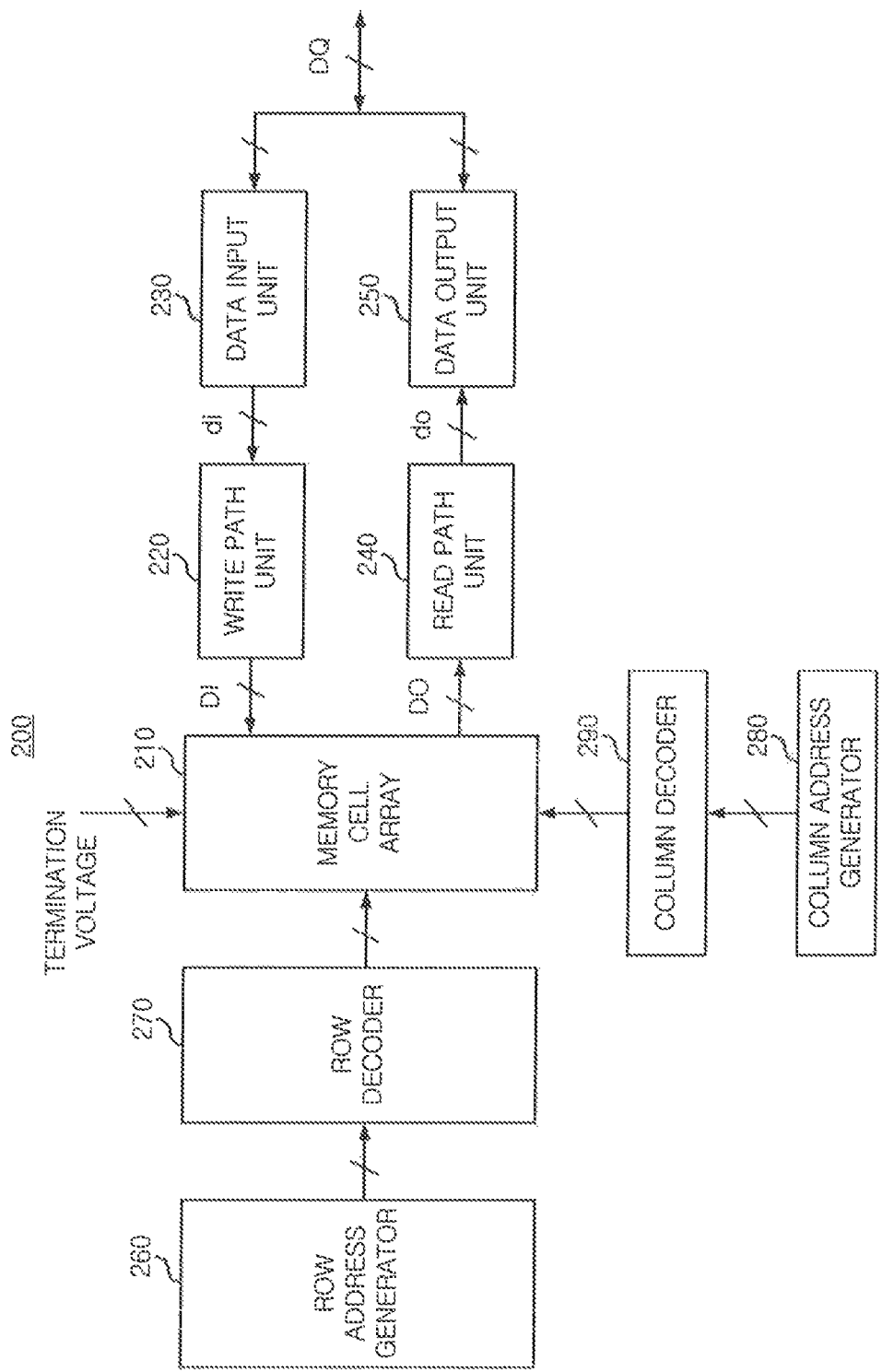
FIG. 6 is a diagram showing a memory unit of FIG. 1 according to an exemplary embodiment of the inventive concept.

FIG. 6 is a diagram showing a memory unit of FIG. 1 according to an exemplary embodiment of the inventive concept.

Referring to FIG. 6, the memory unit 200 may include the memory cell array 210, a write path unit 220, a data input unit 230, a read path unit 240, a data output unit 250, a row address generator 260, a row decoder 270, a column address generator 280, and a column decoder 290.

The row address generator 260 may generate a refresh row address as a row address signal in response to an initial refresh command or a refresh command. The row address generator 260 may generate a row address as the row address signal in response to an active command.

The row decoder 270 may decode the row address signal to generate a plurality of word line selection signals.

The column address generator 280 may generate a column address as a column address signal in response to a write command or a read command.

The column decoder 290 may decode the column address signal to generate a plurality of column selection signals.

The memory cell array 210 may include a plurality of word lines selected by the plurality of word line selection signals. The memory cell array 210 may include a plurality of bit lines selected by the plurality of column selection signals. The memory cell array 210 may include a plurality of memory cells connected between the plurality of word lines and the plurality of bit lines.

The memory cell array 210 may input data to memory cells selected by the plurality of word line selection signals and the plurality of column selection signals in response to the write command. The memory cell array 210 may output data from memory cells selected by the plurality of word line selection signals and the plurality of column selection signals in response to the read command.

The memory cell array 210 may perform an initial refresh operation or a refresh operation on the plurality of memory cells in response to the initial refresh command or the refresh command. The initial refresh operation may be the same as or different from the refresh operation. The memory cell array 210 may simultaneously select at least two word lines (four word lines, eight word lines, or the like, e.g., $2n$ word lines (where n is a natural number)) in response to the initial refresh command, and perform the initial refresh operation on the basis of an amount of charges accumulated on each of the memory cells connected to the at least two selected word lines. Data of "0" or "1" may be stored in each of the memory cells of the memory cell array 210 by the initial refresh operation.

The write path unit 220 may be initialized in response to an initialization signal and have initial data. The write path unit 220 may receive data di in response to the write command and write data DI to the memory cell array 210.

The data input unit 230 may receive data DQ and output the data di to the write path unit 220 when the write command is generated.

The read path unit 240 may receive data DO, which is read from the memory cell array 210, and output data do when the read command is generated.

The data output unit 250 may receive the data do, which is output from the read path unit 240, and output the data DQ, when the read command is generated.

For example, a plurality of input lines for receiving termination voltages may be disposed on the memory cell array 210. The termination voltages which are output from the switch unit 130 may be input to internal nodes of the memory cell array 210 through the input lines.

For example, the termination voltages which are output from the switch unit 130 may be input to the internal nodes of the memory cell array 210 through the data input unit 230 and the write path unit 220.

The memory unit 200 may include an initialization unit and an anti-fuse unit. A defective address signal may be programmed in the anti-fuse unit. When an initialization signal is generated in the initialization unit, the anti-fuse unit may output the programmed defective address signal. When the anti-fuse unit outputs the programmed defective address signal, the anti-fuse unit may generate an initialization termination signal.

The row address generator 260, the column address generator 280, the row decoder 270, the column decoder 290, the data input unit 230, the read path unit 240, the data output unit 250, or the internal nodes of the memory cell array 210 may be initialized to have initial values in response to the initialization signal generated in the initialization unit.

The memory cell array 210 may include redundant memory cells connected between redundant word lines selected by a redundant word line selection signal or redundant bit lines selected by a redundant column selection signal. The defective address signal may be applied to the row decoder 270 or the column decoder 290. The row decoder 270 or the column decoder 290 may not activate a word line selection signal or a column selection signal corresponding to the row address signal or the column address signal when the row address signal or the column address signal matches the defective address signal. When the word line selection signal or the column selection signal is not activated, the row decoder 270 or the column decoder 290 may activate the redundant word line selection signal or the redundant column selection signal. Accordingly, defective memory cells of the memory cell array 210 may be replaced with the redundant memory cells.

Figure 7:
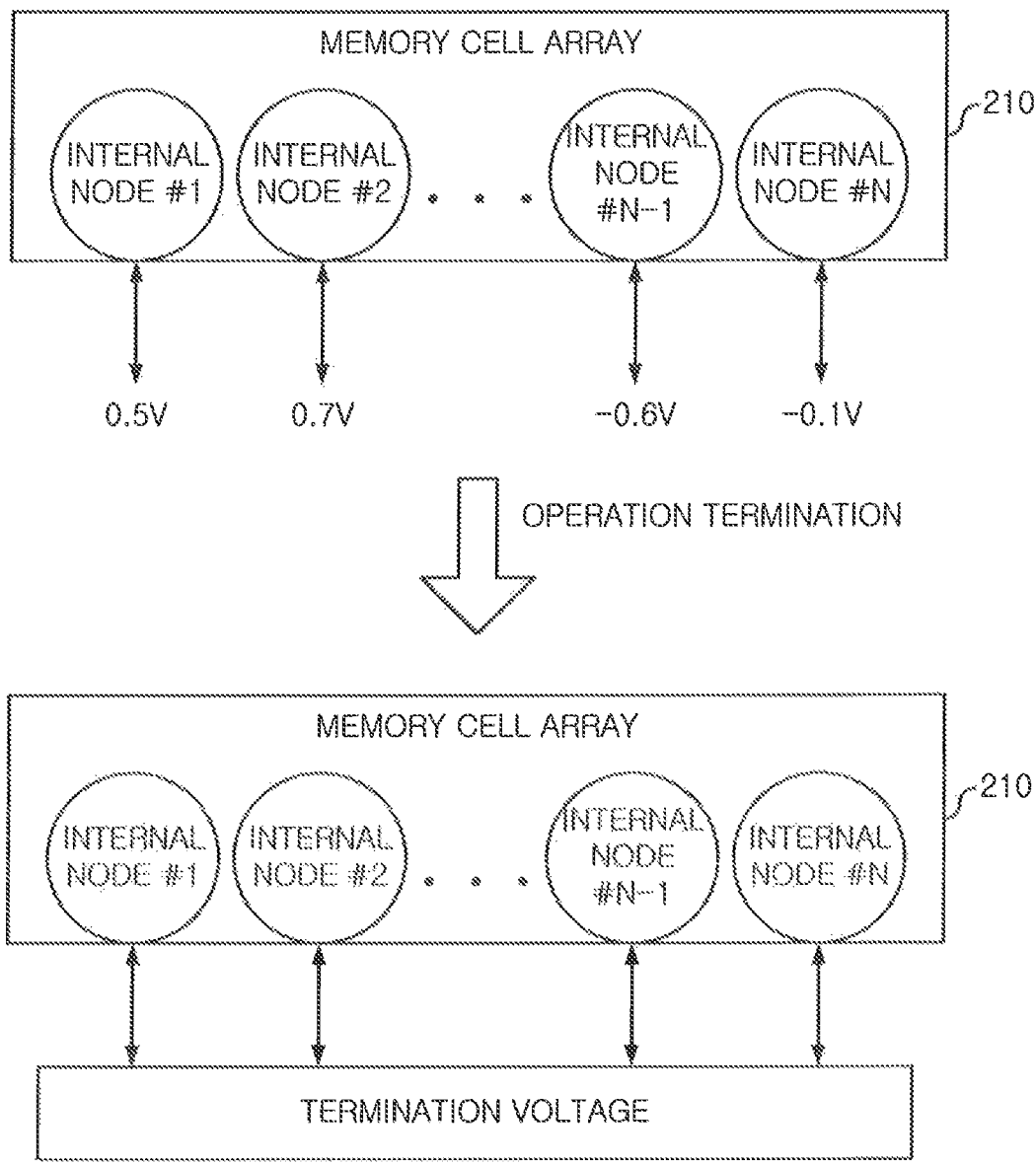
FIG. 7 is a diagram showing voltages of internal nodes which are stabilized with one termination voltage after an operation of a memory apparatus is terminated according to an exemplary embodiment of the inventive concept.
Figure 8:
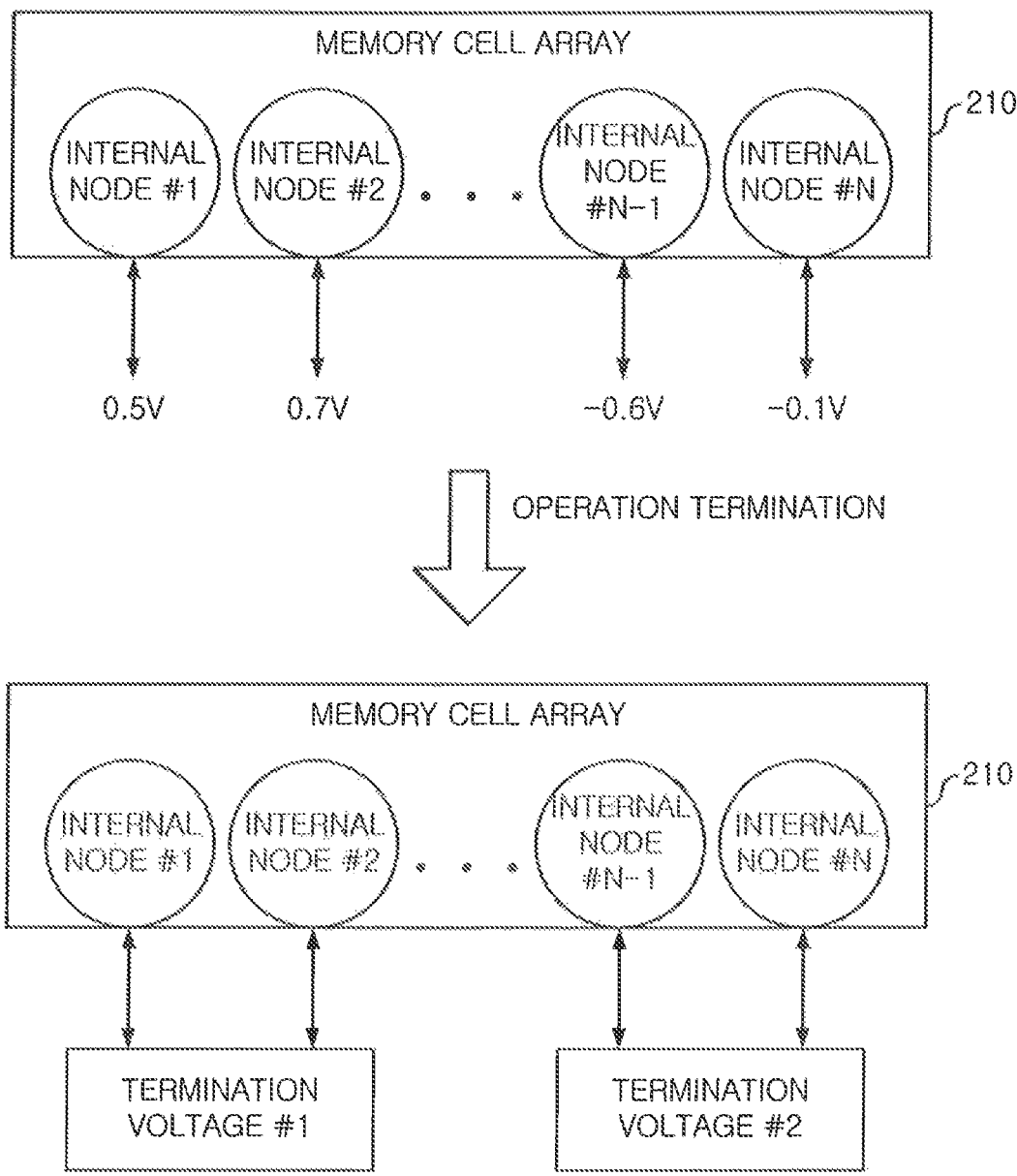
FIG. 8 is a diagram showing voltages of internal nodes which are stabilized with a plurality of termination voltages after an operation of a memory apparatus is terminated according to an exemplary embodiment of the inventive concept.

FIG. 7 is a diagram showing voltages of internal nodes which are stabilized with one termination voltage after an operation of a memory apparatus is terminated according to an exemplary embodiment of the inventive concept. FIG. 8 is a diagram showing voltages of internal nodes which are stabilized with a plurality of termination voltages after an operation of a memory apparatus is terminated according to an exemplary embodiment of the inventive concept.

Referring to FIGS. 1, 7, and 8, when the operation of the semiconductor memory apparatus 10 is terminated without processing voltages which are input to respective memory cells of the memory cell array 210, charges remain inside the respective memory cells of the memory cell array 210.

As shown in FIG. 7, the internal voltage stabilization apparatus 100 may generate the termination voltage having a voltage value of 0 V to −10 V when the internal voltage stabilization apparatus 100 detects that the operation of the semiconductor memory apparatus 10 is terminated. The internal voltage stabilization apparatus 100 may adjust the voltage value of the termination voltage within the range of 0 V to −10 V according to a voltage mode which is input thereto. The internal voltage stabilization apparatus 100 may supply termination voltages having the same voltage value to all of the internal nodes of the memory cell array 210 to stabilize the voltages of all of the internal nodes of the memory cell array 210.

As shown in FIG. 8, the internal voltage stabilization apparatus 100 may generate a plurality of termination voltages having voltage values of 0 V to −10 V when the internal voltage stabilization apparatus 100 detects that the operation of the semiconductor memory apparatus 10 is terminated. The internal voltage stabilization apparatus 100 may adjust the voltage values of the termination voltages within the range of 0 V to −10 V according to a voltage mode which is input thereto.

For example, the internal voltage stabilization apparatus 100 may supply the first termination voltage to some of the internal nodes of the memory cell array 210. The internal voltage stabilization apparatus 100 may supply the second termination voltage to the remaining internal nodes among the internal nodes of the memory cell array 210. The first termination voltage and the second termination voltage may have different voltage values. The internal voltage stabilization apparatus 100 may supply the termination voltages to all of the internal nodes of the memory cell array 210 to stabilize the voltages of all of the internal nodes of the memory cell array 210. Accordingly, the semiconductor memory apparatus 10 according to an exemplary embodiment of the inventive concept may stabilize the voltages of all of the internal nodes of the memory cell array 210 with the termination voltages to prevent an operation error, a characteristic change, or degradation of a capacitor due to the remaining charges.

Figure 9:
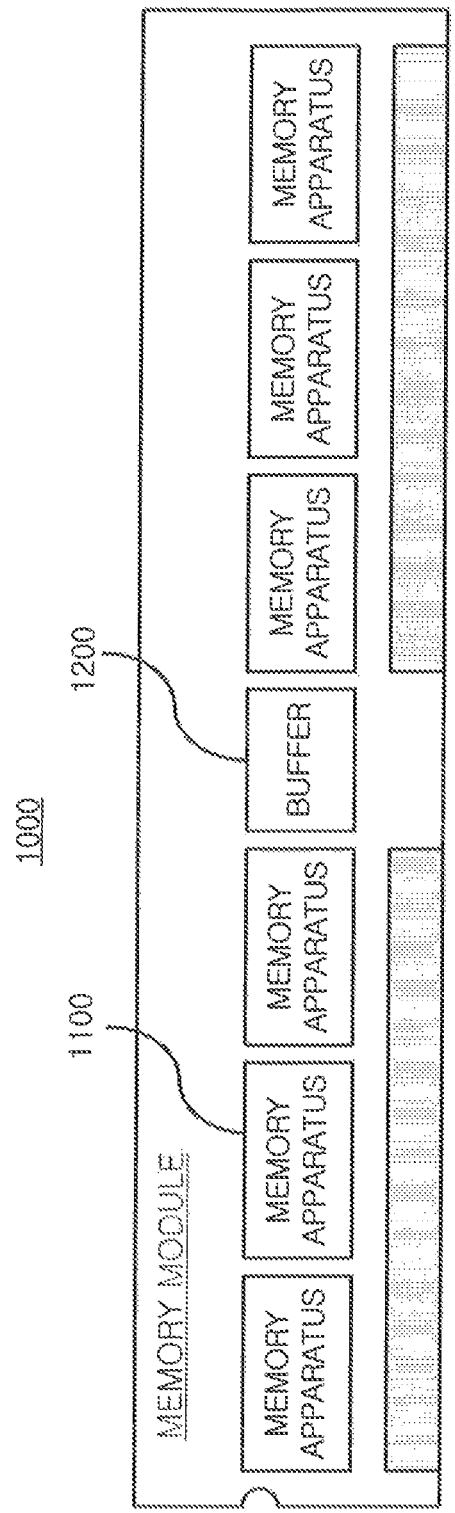
FIG. 9 is a diagram showing a memory module to which a semiconductor memory apparatus according to an exemplary embodiment of the inventive concept is applied.

FIG. 9 is a diagram showing a memory module to which a semiconductor memory apparatus according to an exemplary embodiment of the inventive concept is applied.

Referring to FIG. 9, a memory module 1000 may include a plurality of memory apparatuses 1100. In exemplary embodiments of the inventive concept, the memory module 1000 may be an unbuffered dual in-line memory module (UDIMM), a registered dual in-line memory module (RDIMM), a fully buffered dual in-line memory module (FBDIMM), a load reduced dual in-line memory module (LRDIMM), or the like.

The memory module 1000 may receive commands, addresses, and data from a memory controller through a plurality of signal lines. The memory module 1000 may further include a buffer 1200, which buffers the commands, the addresses, and the data and provides the commands, the addresses, and the data to the memory apparatuses 1100. The memory apparatuses 1100 of the memory module 1000 may be implemented as the semiconductor memory apparatus 10 shown in FIGS. 1 to 8.

Data transmission lines may be connected between the buffer 1200 and the memory apparatuses 1100 in a point-to-point manner. In addition, command-and-address transmission lines may be connected between the buffer 1200 and the memory apparatuses 1100 in a multi-drop manner, a daisy-chain manner, or a fly-by-daisy-chain manner. Since the buffer 1200 buffers all of the commands, the addresses, and the data, the memory controller may interface with the memory module 1000 by driving only the load of the buffer 1200. The number of memory apparatuses 1100 shown in FIG. 9 is merely exemplary. For example, the memory module 1000 may include a greater number of the memory apparatuses 1100 and memory ranks, and a memory system may include a plurality of the memory modules 1000.

Figure 10:
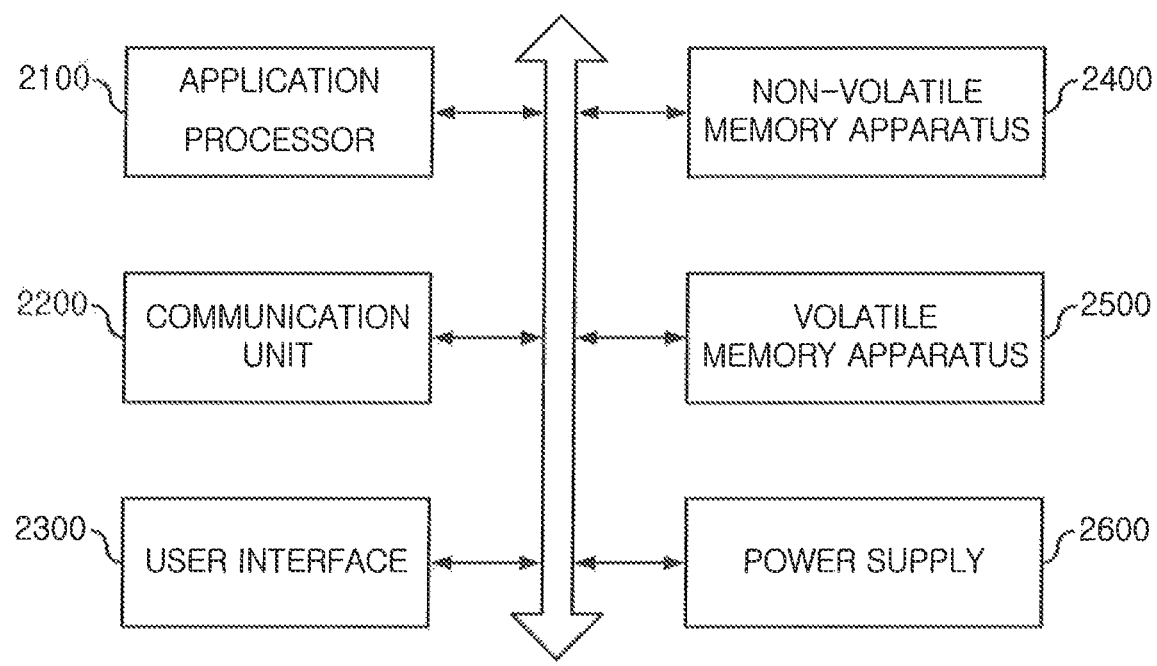
FIG. 10 is a diagram showing a mobile system to which a semiconductor memory apparatus according to an exemplary embodiment of the inventive concept is applied.

FIG. 10 is a diagram showing a mobile system to which a semiconductor memory apparatus according to an exemplary embodiment of the inventive concept is applied.

Referring to FIG. 10, a mobile system 2000 may include an application processor 2100, a communication unit 2200, a user interface 2300, a non-volatile memory (NVM) apparatus 2400, a volatile memory (VM) apparatus 2500, and a power supply 2600.

For example, the mobile system 2000 may be an arbitrary mobile system, such as a mobile phone, a smart phone, a personal digital assistant (PDA), a portable multimedia player (PMP), a digital camera, a music player, a portable game console, a navigation system, or the like.

The application processor 2100 may execute applications which provide Internet browsers, games, moving pictures, or the like. For example, the application processor 2100 may include one processor core (a single core) or a plurality of cores (a multi-core). For example, the application processor 2100 may include a multi-core such as a dual-core, a quad-core, a hexa-core, or the like. For example, the application processor 2100 may further include a cache memory positioned inside or outside the application processor 2100.

The communication unit 2200 may perform wireless communication or wired communication with an external apparatus. For example, the communication unit 2200 may perform Ethernet communication, near field communication (NFC), radio frequency identification (RFID) communication, mobile telecommunication, memory card communication, Universal Serial Bus (USB) communication, or the like.

For example, the communication unit 2200 may include a baseband chipset and may support communication such as Global System for Mobile communications (GSM), General Packet Radio Service (GPRS), Wideband Code Division Multiple Access (WCDMA), High Speed Up/Down Packet Access (HSxPA), or the like.

The VM apparatus 2500 may store data processed by the application processor 2100 or operate as a working memory. The VM apparatus 2500 may be implemented as the semiconductor memory apparatus 10 shown in FIGS. 1 to 8.

The NVM apparatus 2400 may store a boot image for booting the mobile system 2000. For example, the NVM apparatus 2400 may be implemented as an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or a similar memory.

The user interface 2300 may include one or more input apparatuses, such as a keypad and a touch screen, and/or one or more output apparatuses, such as a speaker and a display apparatus.

The power supply 2600 may supply an operation voltage of the mobile system 2000.

Further, in exemplary embodiments of the inventive concept, the mobile system 2000 may further include an image processor, and a storage device such as a memory card, a solid state drive (SSD), or the like.

The mobile system 2000 or the components of the mobile system 2000 may be mounted using various types of packages. For example, the mobile system 2000 or the components of the mobile system 2000 may be mounted using a package on package (PoP), ball grid arrays (BGAs), chip scale packages (CSPs), a plastic leaded chip carrier (PLCC), a Plastic Dual In-line Package (PDIP), die in a waffle pack, die in a wafer form, a chip on board (COB), a Ceramic Dual In-line Package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system in package (SIP), a multi-chip package (MCP), a wafer-level fabricated package (WFP), a wafer-level processed stack package (WSP), or the like.

As described above, according to exemplary embodiments of the inventive concept, voltages of internal nodes of a DRAM can be stabilized when an operation of the DRAM is terminated.

According to exemplary embodiments of the inventive concept, an internal voltage of a DRAM can be reset to have a preset voltage when an operation of the DRAM is terminated.

While the inventive concept has been shown and described with reference to exemplary embodiments thereof, it should be understood by those of ordinary skill in the art that various modifications in form and details may be made thereto without departing from the spirit and scope of the inventive concept as set forth by the following claims.

What is claimed is:

1. A semiconductor memory apparatus comprising a memory cell unit and an internal voltage stabilization apparatus,
   wherein the memory cell unit comprises:
      a row decoder configured to decode a row address signal and generate a plurality of word line selection signals,
      a column decoder configured to decode a column address signal and generate a plurality of column selection signals, and
      a memory cell array comprising a plurality of memory cells connected between a plurality of word lines and a plurality of bit lines; and
   the internal voltage stabilization apparatus comprises:
      an operation termination determination unit configured to determine whether an operation of the semiconductor memory apparatus is terminated on the basis of an external input voltage, and output an operation termination command,
      a termination voltage generation unit configured to generate a termination voltage having a preset voltage value on the basis of a determination result of operation termination by the operation termination determination unit, and
      a switch unit comprising a plurality of switches that are turned on in response to the operation termination command, and configured to supply the termination voltage, input from the termination voltage generation unit, to a plurality of internal nodes of the memory cell array.

2. The semiconductor memory apparatus of claim 1, wherein the termination voltage generation unit adjusts a value of the termination voltage according to a voltage mode which is input thereto.

3. The semiconductor memory apparatus of claim 2, wherein the termination voltage generation unit generates one termination voltage on the basis of the voltage mode and outputs the one termination voltage to the switch unit.

4. The semiconductor memory apparatus of claim 3, wherein the switch unit supplies the one termination voltage to the plurality of internal nodes of the memory cell array.

5. The semiconductor memory apparatus of claim 2, wherein the termination voltage generation unit comprises a plurality of termination voltage generators,
   the termination voltage includes a plurality of termination voltages having different values generated by the plurality of termination voltage generators, and
   the termination voltage generation unit supplies the plurality of termination voltages generated by the plurality of termination voltage generators to different switches.

6. The semiconductor memory apparatus of claim 5, wherein the switch unit supplies the plurality of termination voltages to the plurality of internal nodes of the memory cell array.

7. The semiconductor memory apparatus of claim 2, wherein the termination voltage generation unit comprises a plurality of termination voltage generators,
   wherein some of the plurality of termination voltage generators generate a first termination voltage;
   remaining generators among the plurality of termination voltage generators generate a second termination voltage; and
   the termination voltage generation unit supplies the first termination voltage and the second termination voltage to different switches.

8. The semiconductor memory apparatus of claim 7, wherein the switch unit supplies the first termination voltage to a first internal node of the memory cell array and supplies the second termination voltage to a second internal node of the memory cell array.

9. The semiconductor memory apparatus of claim 2, wherein the termination voltage generation unit outputs an internal voltage, generated in the semiconductor memory apparatus, to the switch unit as the termination voltage.

10. The semiconductor memory apparatus of claim 2, wherein the termination voltage generation unit is configured to:
    select one internal voltage among a plurality of internal voltages generated in the semiconductor memory apparatus on the basis of the voltage mode; and
    output the selected one internal voltage to the switch unit as the termination voltage.

11. The semiconductor memory apparatus of claim 2, wherein the termination voltage is greater than or equal to 0 V and less than or equal to −10 V.

12. The semiconductor memory apparatus of claim 1, wherein the memory cell unit is a dynamic random access memory (DRAM).

* * * * *